(12) United States Patent
Buehler

(10) Patent No.: US 6,919,716 B1
(45) Date of Patent: Jul. 19, 2005

(54) PRECISION AVALANCHE PHOTODIODE CURRENT MONITOR

(75) Inventor: Kevin Buehler, Sachse, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/229,665

(22) Filed: Aug. 28, 2002

(51) Int. Cl.⁷ .................. G01R 19/00; G01R 31/305; G01R 31/302; G01R 31/308
(52) U.S. Cl. ............... 324/96; 324/751; 324/752; 324/753; 324/76.11
(58) Field of Search ............... 324/76.11, 751, 324/752, 753, 96; 250/214 R; 356/218, 223, 226, 227

(56) References Cited

U.S. PATENT DOCUMENTS

| | | | |
|---|---|---|---|
| 4,199,753 A * | 4/1980 | Gontowski, Jr. ............ 340/555 |
| 4,271,364 A * | 6/1981 | Leonard .................... 327/205 |
| 5,103,159 A | 4/1992 | Breugnot et al. ........... 323/315 |
| 5,929,434 A * | 7/1999 | Kozlowski et al. ..... 250/214 A |
| 6,188,059 B1 | 2/2001 | Nishiyama et al. ......... 250/214 |
| 6,300,615 B1 * | 10/2001 | Shinohara et al. ...... 250/214 R |
| 6,333,804 B1 | 12/2001 | Nishiyama et al. ......... 359/189 |
| 6,469,489 B1 * | 10/2002 | Bourquin et al. ............. 324/96 |
| 6,765,714 B1 * | 7/2004 | Talmadge et al. ....... 359/341.41 |
| 2003/0178552 A1 * | 9/2003 | Hofmeister et al. .... 250/214 R |

* cited by examiner

Primary Examiner—Anjan Deb
Assistant Examiner—John Teresinski
(74) Attorney, Agent, or Firm—Ritter, Lang & Kaplan LLP

(57) ABSTRACT

Precision measurement of optical signal power is provided. In one implementation, a Wilson current mirror senses current through an avalanche photodiode (APD) that has been exposed to the optical signal. The output of this APD may also be used to recover data. By incorporating a high voltage transistor as the buffer, the Wilson current mirror is able to operate in series with the APD at a high bias level.

18 Claims, 2 Drawing Sheets

US 6,919,716 B1

PRECISION AVALANCHE PHOTODIODE CURRENT MONITOR

BACKGROUND OF THE INVENTION

The present invention relates generally to optical signals and also to electrical circuitry.

It is desirable to measure the received power of an optical signal in an optical communication system. The received power measurement is useful in monitoring and controlling operation of an optical communication link.

One way to accomplish this measurement would be to tap off a portion of the received optical signal and then measure the power level of this tapped portion. However, the necessary fiber taps, splices, and the routing and management of fiber are both cumbersome and expensive. Also, the total received signal level may be quite small, bringing the power level of a tapped signal close to or below the threshold of accurate measurement.

Accordingly, a class of optical power measurement techniques has been developed that take advantage of the photodiode used to recover the modulation on the optical signal. These techniques measure the current through this photodiode and apply a multiplicative factor to estimate the received power.

A typical power measurement circuit of this type involves placing a sensing resistor in series with an avalanche photodiode (APD). The voltage across this resistor is sensed, converted to a proportionate current by a voltage to current converter, and input to a logarithmic amplifier. Measurement inaccuracies result from variations in the sense resistor's resistance over temperature and voltage-to-current converter offset and gain variations due to temperature changes. Resolution at low power levels is also very poor.

Another approach avoids the problems inherent in using a resistor to sense voltage by using a current mirror to measure the current through the APD. Conventional current mirrors, however, are not very accurate over variations in temperature and current level. Precision current mirrors do not operate well at the high voltage bias levels demanded by APDs.

What is needed are improved systems and methods for precisely measuring optical power levels.

SUMMARY OF THE INVENTION

By virtue of one embodiment of the present invention, precision measurement of optical signal power is provided. In one implementation, a Wilson current mirror senses current through an avalanche photodiode (APD) that has been exposed to the optical signal. The output of this APD may also be used to recover data. By incorporating a high voltage transistor as the buffer, the Wilson current mirror is able to operate in series with the APD at a high bias level.

A first aspect of the present invention provides apparatus for measuring power of an optical signal. The apparatus includes: an avalanche photo diode that outputs a current responsive to power of the optical signal, and a Wilson current mirror that provides a mirrored current in response to the current output by the avalanche photo diode.

A second aspect of the present invention provides a method for measuring power of an optical signal. The method includes: stimulating current output from an avalanche photo diode using the optical signal, and mirroring the current output using a Wilson current mirror.

A third aspect of the present invention provides apparatus for measuring power of an optical signal. The apparatus includes: means for stimulating electrical current production using the optical signal, and a Wilson current mirror that mirrors the electrical current produced by the stimulating means.

Further understanding of the nature and advantages of the inventions herein may be realized by reference to the remaining portions of the specification and the attached drawings.

DESCRIPTION OF SPECIFIC EMBODIMENTS

The present invention will be described with reference to an application in an optical receiver system. An optical signal carrying modulated data has its power measured. The optical signal may be a selected wavelength received over a WDM link. It will be appreciated, however, that the present invention is not limited to these applications.

Figure 1:
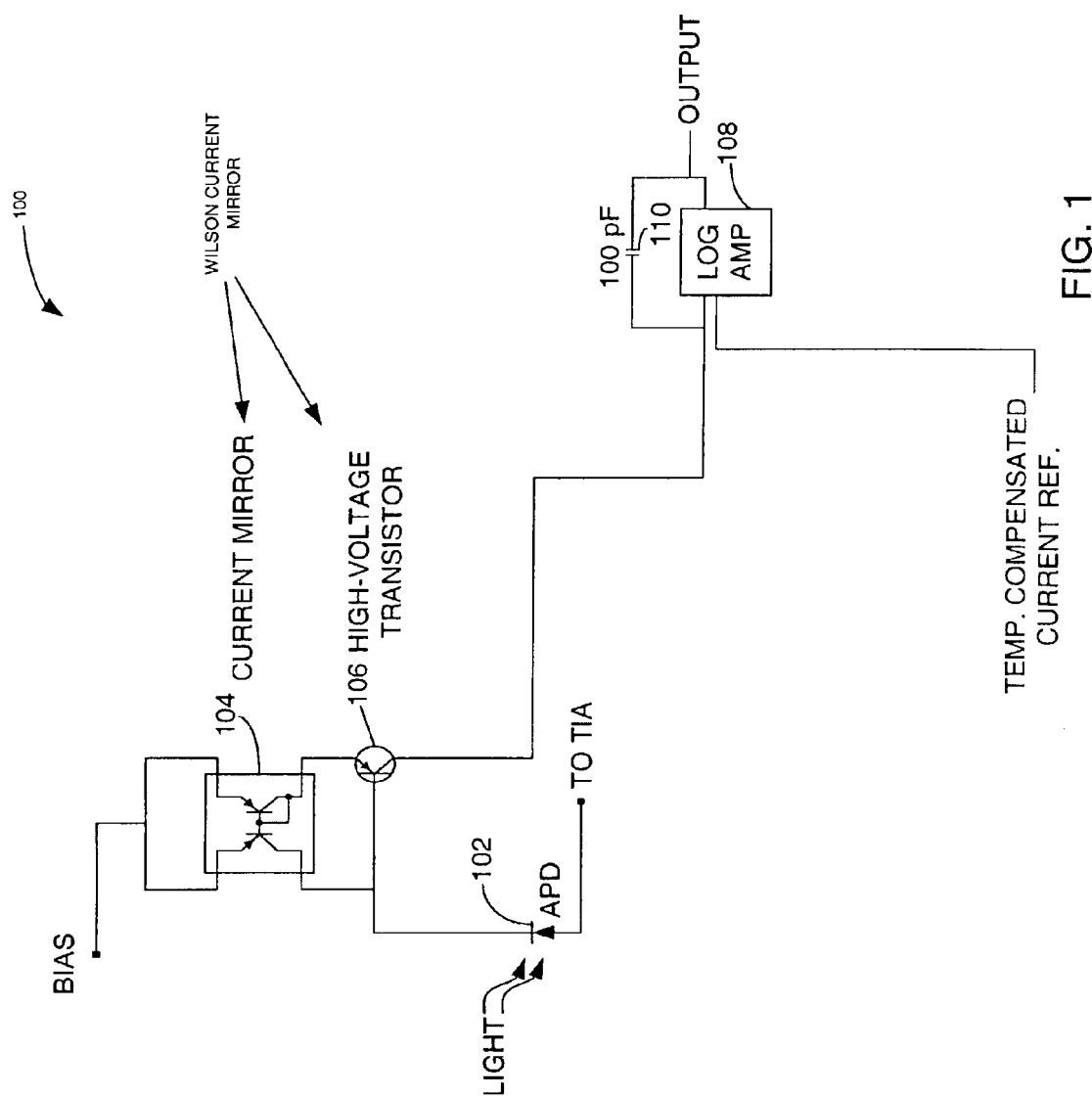
FIG. 1 depicts an optical signal power measurement system according to one embodiment of the present invention.

FIG. 1 depicts an optical signal power measurement system 100 according to one embodiment of the present invention. The overall system will first be discussed and then details of individual components.

An avalanche photo diode (APD) 102 is exposed to the optical signal (light) whose power is to be measured. In response, APD 102 produces a current proportionate to the intensity of the optical signal. The optical signal is typically amplitude modulated to carry data The data may be recovered from variations in current output by the APD 102. A trans-impedance amplifier (not shown) receives the current from APD 102 for conditioning of the electrical signal in preparation for data recovery.

According to one embodiment of the present invention, a current mirror 104 is coupled to the other side of APD 102. The current mirror 104 mirrors the current from APD 102. APD 102 operates at a high bias level. A high-voltage bipolar PNP transistor 106 acts as a unity gain current stage while also allowing the current mirror 104 to see a low voltage between collectors and emitters despite the high bias voltage applied to APD 102. The combination of the current mirror 104 and the PNP transistor 106 forms a Wilson mirror, which provides excellent stability over temperature and low variation over process. Although the two transistors of current mirror 104 should be a matched pair, they need not also be matched to transistor 106.

The current output from high-voltage PNP transistor 106 is then input to a logarithmic amplifier 108. Logarithmic amplifier 108 outputs a voltage proportional to a logarithm of a ratio of the current output of transistor 106 over a reference current provided by a temperature-compensated current source (not shown). A 100 pF capacitor 110 provides stability to the logarithmic amplifier across the expected operating range of this device. In this implementation, this is from 1 uA to 300 uA. It will of course be appreciated that the correct capacitance value will be determined based on the operating range and manufacturer's recommendations for the particular logarithmic amplifier selected. The datasheet for the particular logarithmic amplifier should be consulted to determine the correct value for this capacitor.

APD 102 maybe, e.g., a FRMSN143DS available from Fujitsu, an ERM578, available from JDS Uniphase, etc. For APD 102, there is a responsivity parameter that indicates the percentage of incident light that is converted to photons. There is also an M factor that indicates the number of electrons produced for each incident photon. The relationship between incident optical power and generated current is substantially set by the responsivity and M factor. Responsivity will vary somewhat over process, typically by less than +/−0.05. The M factor varies depending on bias across the diode and temperature.

A separate circuit (not shown) can be used to thermally compensate the M factor to maintain it constant over temperature variation. Also, one can scale the bias voltage in inverse proportion to the amount of received power in order to achieve a quasi-"AGC" effect. This can be accomplished simply by inserting a resistor in series between the APD bias voltage and the APD device. Other implementations refine bias voltage control by incorporating a feedback loop from the output of the current sense circuitry to the APD bias generating circuit. If any of these methods are used, it is necessary to account for this change in bias, and therefore change in M factor, when calculating received power. In one implementation that uses a feedback loop, for an incident optical power, $P_{opt}$=−36.5 dBm, responsivity is 0.65, M=7, and, $I_{apd}$=1 $\mu$A. For $P_{opt}$=−8 dBm, responsivity is 0.70, M=3, and $I_{apd}$=332 $\mu$A.

Current mirror 104 consists of two closely matched PNP transistors in an integrated package. In one implementation, current mirror 104 is a BCV626C as available from Philips Fairchild. The collector of the transistor depicted at the left of current mirror 104 is coupled to APD 102. Both emitters of current mirror 104 are coupled to a bias voltage source for APD 102. The bias voltage may be, e.g., 30 V, 100 V, or even greater.

The right collector of current mirror 104 is coupled to the emitter of high-voltage transistor PNP transistor 106. High-voltage PNP transistor 106 may be an A29LT1 available from numerous manufacturers such as Motorola, Inc. The base of transistor 106 is coupled to APD 102 and the left collector of current mirror 104. Transistor 106 can tolerate 300V between its collector and emitter. By contrast, the collector to emitter voltages of current mirror 104 never exceeds approximately 1.4 volts. The configuration provided by this embodiment of the present invention thus allows for high voltage bias to be applied to APD 102 while permitting the use of the very precise Wilson current mirror that can tolerate high voltages.

In one implementation, logarithmic amplifier 108 is, e.g., a LOG102 available from Texas Instruments. The reference current input to logarithmic amplifier 108 may be, e.g., 1 $\mu$A. Logarithmic amplifier 108 may be provided with supply voltages of −12 and +12 volts (not shown). If APD current varies from 0.1 $\mu$A to 300 $\mu$A, the voltage output from logarithmic amplifier 108 will vary from −1 volts to approximately 2.5 volts. This voltage output accurately tracks optical power over a wide range of temperatures and bias voltages and is also robust to process-related variations in components.

Figure 2:
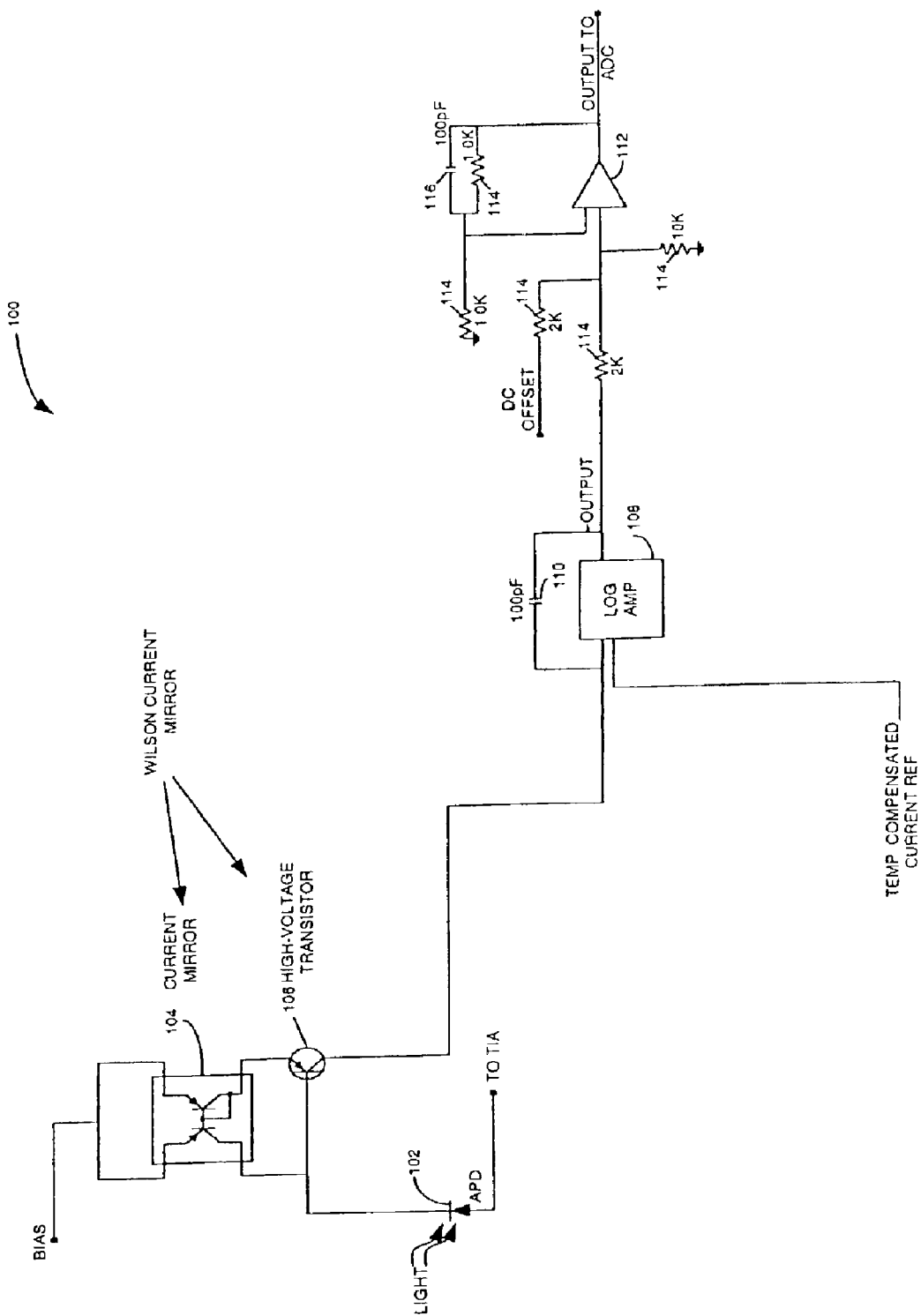
FIG. 2 depicts an optical signal power measurement system augmented to interface to an analog to digital converter input according to one embodiment of the present invention.

It may also be desirable to scale and offset the output of logarithmic amplifier 108 to match the input of an analog to digital converter. FIG. 2 depicts an optical signal power measurement system augmented to interface to an analog to digital converter input according to one embodiment of the present invention. An operational amplifier 112 is used to scale and offset the output of logarithmic amplifier 108. Operational amplifier 112 may be a generic LMC6482 as available from National Semiconductor powered by +5 volts and −5 volts supply inputs. A DC offset line sets the DC offset of the output of operational amplifier 112. This offset line may be connected to a fixed voltage reference or alternatively to an output of a digital to analog converter to allow for digitally controlled offset calibration. The values of resistors 114 are set to provide an output variation from 0 volts to 2.5 volts in response to an input variation of −2.5 volts to +2.5 volts. Capacitor 116 is provided for frequency compensation.

Traditional optical power measurement circuits may experience total errors of several hundred percent due to process-related variations, temperature-related variations, aging-related variations, etc. Much of this error is difficult to compensate. By contrast, the optical power measurement system described above exploits the Wilson current mirror to provide precise measurements that are robust to these variations. Although a Wilson mirror is typically used to improve load regulation, here other benefits are provided. Use of the third transistor provides tolerance to the high bias voltage employed by the APD. Since most of the voltage is across this third buffer transistor, a highly precise low voltage matched pair may be used. The Wilson current mirror also provides excellent performance over variations in temperature and bias voltage.

It is understood that the examples and embodiments that are described herein are for illustrative purposes only and that various modifications and changes in light thereof will be suggested to persons skilled in the art and are to be included within the spirit and purview of this application and scope of the appended claims and their full scope of equivalents.

What is claimed is:

1. Apparatus for measuring power of an optical signal, said apparatus comprising:
   an avalanche photo diode that outputs a current responsive to power of said optical signal;
   a Wilson current mirror that provides a mirrored current of said current output by said avalanche photo diode; and
   a logarithmic amplifier that develops a voltage accurately indicative of said optical signal power over a range of temperatures in response to said mirrored current and a temperature-compensated current reference.

2. The apparatus of claim 1 wherein said logarithmic amplifier receives said mirrored current and said temperature-compensated current reference as input and said developed voltage comprises a voltage proportional to a logarithm of a ratio of said mirrored current over said temperature-compensated current reference.

3. The apparatus of claim 2 wherein said Wilson current mirror comprises:
   a matched pair of transistors;
   a high-voltage transistor that operates as a unit-gain current buffer between said matched pair and said logarithmic amplifier.

4. The apparatus of claim 3 wherein said high-voltage transistor comprises a bipolar transistor.

5. The apparatus of claim 3 further comprising an amplifier connected to an output of said logarithmic amplifier.

6. The apparatus of claim 3 wherein a bias voltage for said avalanche photo diode is coupled to emitters of said matched pair.

7. The apparatus of claim 3 wherein a first collector of said matched, pair is coupled to said avalanche photo diode and a base of said high-voltage transistor and a second collector of said matched pair is coupled to an emitter of said high-voltage transistor.

8. A method for measuring power of an optical signal, said method comprising:
   stimulating current output from an avalanche photo diode using said optical signal;
   mirroring said current output using a Wilson current mirror;
   within said Wilson current mirror, buffering said mirrored current through a high-voltage transistor; and
   logarithmically amplifying said mirrored current as buffered by said high-voltage transistor to develop an voltage accurately indicative of said power of said optical signal over a range of temperatures.

9. The method of claim 8 wherein in said logarithmically amplifying step, said accurately indicative voltage comprises a voltage proportional to a logarithm of a ratio of said mirrored current over a temperature-compensated current reference.

10. The method of claim 9 further comprising:
    amplifying said accurately indicative voltage.

11. The method of claim 8 wherein said Wilson current mirror comprises a matched transistor pair and a high-voltage buffer transistor.

12. The method of claim 11 wherein a first collector of said matched pair is coupled to said avalanche photodiode.

13. The method of claim 11 wherein emitters of said matched pair are coupled to a bias source for said avalanche photo diode.

14. Apparatus for measuring power of an optical signal, said apparatus comprising:
    means for stimulating electrical current production using said optical signal;
    a Wilson current mirror that mirrors said electrical current produced by said stimulating means; and
    means for logarithmically amplifying said mirrored current as buffered by said Wilson current mirror to develop a voltage accurately indicative of said power of said optical signal over a range of temperatures.

15. The apparatus of claim 14 wherein said Wilson current mirror comprises:
    a matched transistor pair; and
    means for buffering mirrored current output from said matched transistor pair.

16. The apparatus of claim 15 wherein said buffering means comprises a high-voltage transistor.

17. The apparatus of claim 14 wherein said stimulating means comprises an avalanche photo diode.

18. The apparatus of claim 14 wherein accurately indicative voltage comprises a voltage proportional to a logarithm of a ratio of said mirrored current over a temperature-compensated current reference.

* * * * *